(12) United States Patent
Banai et al.

(10) Patent No.: US 8,258,831 B1
(45) Date of Patent: Sep. 4, 2012

(54) METHOD AND APPARATUS FOR CLOCK GENERATOR LOCK DETECTOR

(75) Inventors: Yiftach Banai, Modiin (IL); Reuven Ecker, Haifa (IL)

(73) Assignee: Marvell Israel (M.I.S.L) Ltd., Yokneam (IL)

( * ) Notice: Subject to any disclaimer, the term of this patent is extended or adjusted under 35 U.S.C. 154(b) by 57 days.

(21) Appl. No.: 12/851,280

(22) Filed: Aug. 5, 2010

Related U.S. Application Data

(60) Provisional application No. 61/259,592, filed on Nov. 9, 2009.

(51) Int. Cl.
*H03L 7/06* (2006.01)

(52) U.S. Cl. .......... 327/155; 327/47; 327/150; 327/156; 327/159; 327/147; 331/1 A; 331/DIG. 2

(58) Field of Classification Search ............... 327/47–49, 327/7–10, 12, 146–147, 150, 155–156, 159, 327/162–163; 375/375–376; 331/25, 1 A, 331/DIG. 2
See application file for complete search history.

(56) References Cited

U.S. PATENT DOCUMENTS

| | | | | |
|---|---|---|---|---|
| 6,483,361 | B1 * | 11/2002 | Chiu | 327/159 |
| 6,714,083 | B2 * | 3/2004 | Ishibashi | 331/1 A |
| 6,927,635 | B2 * | 8/2005 | Miki et al. | 331/1 A |
| 7,123,065 | B1 | 10/2006 | Moyal | |
| 7,511,543 | B2 * | 3/2009 | Friedman et al. | 327/156 |
| 2005/0084051 | A1 * | 4/2005 | Nauta et al. | 375/376 |
| 2008/0036543 | A1 | 2/2008 | Bazes | |

OTHER PUBLICATIONS

Devon Fernandez and Sanjeev Manandhar; Digital Phase Locked Loop; Dec. 8, 2003.

* cited by examiner

*Primary Examiner* — An Luu

(57) ABSTRACT

A clock generator is disclosed that includes a lock detector. The lock detector is configured to generate a lock signal based on control signals of a phase lock loop circuit that generates an output clock of a desired frequency that is phase locked to a reference clock. The lock detector generates a mismatch signal based on a comparison between the phases of the reference clock and the output clock to generate a compare result. The lock detector delays the compare result by a time period $T_d$ and AND the delayed compare result with the compare result to generate the mismatch signal. The lock detector includes a lock-counter that counts a number of reference clock cycles when the mismatch signal remains at 0. The lock signal indicates that a lock-state is achieved when the number of counted reference clock cycles equals a set-value.

14 Claims, 13 Drawing Sheets

METHOD AND APPARATUS FOR CLOCK GENERATOR LOCK DETECTOR

INCORPORATION BY REFERENCE

This application claims the benefit of U.S. Provisional Application No. 61/259,592, "PLL lock detection using up/down PFD signals" filed on Nov. 9, 2009, including all cited references which are incorporated herein by reference in their entirety.

BACKGROUND

High frequency clocks in electronic devices are often generated by a phase lock loop (PLL) circuit. Usually, the PLL circuit inputs a very accurate low frequency reference clock and generates a high frequency output clock that is phase aligned with the reference clock. If the phase alignment is achieved, the PLL is said to be in a lock-state. In many electronic devices, the output clock of the PLL is not used until the lock-state is established.

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

SUMMARY

A clock generator is disclosed that includes a lock detector. The lock detector is configured to generate a lock signal based on control signals of the PLL. For example, the PLL generates control signals such as an up signal and a down signal and outputs an output clock based on the up and down signals. The up signal indicates a phase of a reference clock and the down signal indicates a phase of a divided_output_clock that is the output clock divided by a frequency divider. The divided_output_clock is generated to have a phase that corresponds to a phase of the output clock. The PLL may use the up and down control signals to control a voltage controlled oscillator that outputs the output clock at a desired frequency.

The lock detector generates a mismatch signal based on a difference between the phases of the reference clock and the divided_output_clock. The lock detector compares the up and the down signals using an XOR circuit, for example, to generate a compare result. Because the up and the down signals indicate the phases of the reference clock and the divided_output_clock, respectively, the compare result indicates a phase difference between the reference clock and the divided_output_clock.

The compare result may provide a phase difference for each cycle of the reference clock. Thus, the compare result may rapidly change when the PLL is in a locking process during initial power on or during a frequency change. Additionally, when the phases of the reference clock and the divided_output_clock are very close, the compare result may indicate short periods of mismatches between the up and the down signals when the PLL is in fact in a lock-state. These effects are noise when determining whether the PLL has achieved the lock-state where the phase of divided_output_clock is within a match range of the phase of the reference clock.

The lock detector filters out the above described noise by implementing a guard band that has two components. The first component is a time delay filter of the compare result. The lock detector delays the compare result by a time period $T_d$ and AND the delayed compare result with the compare result to generate the mismatch signal. $T_d$ defines the match range. The mismatch signal is a 1 (logical high) when the difference in phase of the reference clock and the divided-output clock exceeds the match range. The mismatch signal is a 0 (logical low) when the phase difference of the reference clock and the divided_output_clock does not exceed the match range.

The second component is a lock-counter that counts a number of reference clock cycles that the mismatch signal remains at 0. The lock signal indicates that the lock-state is achieved only when the number of counted cycles equals a set-value. The lock detector samples the mismatch signal using the up and the down signals and clears the number when the sampled mismatch signal is 1. When two counters are used, one for the up signal and one for the down signal, the lock detector only indicates the lock-state when the counters have counted the set-value of the reference clock cycles and the set-value of the output clock cycles that correspond to the counted reference clock cycles.

BRIEF DESCRIPTION OF THE DRAWINGS

Various embodiments of this disclosure that are proposed as examples will be described in detail with reference to the following figures, wherein like numerals reference like elements, and wherein.

DETAILED DESCRIPTION OF EMBODIMENTS

Figure 1:
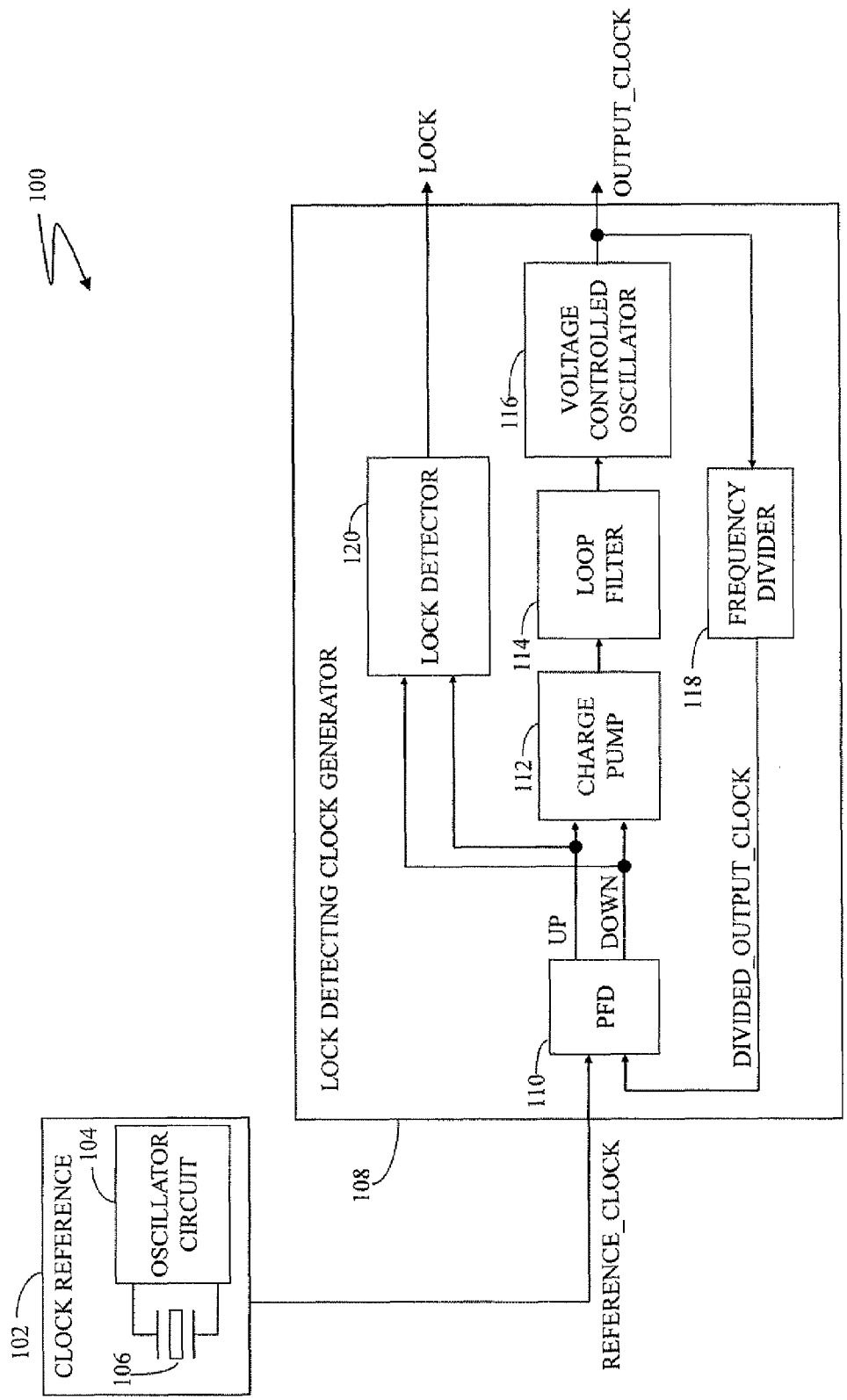
FIG. 1 illustrates a block diagram of a clock circuit that includes a clock reference and a lock detecting clock generator.

FIG. 1 shows a clock circuit 100 that performs a lock detection function. Clock circuit 100 includes a clock reference 102 and a lock detecting clock generator 108. In an embodiment, clock reference 102 is a crystal oscillator that includes an oscillator circuit 104 and a crystal 106. Crystal oscillators are often used to generate very accurate low frequency clocks and are used as reference clocks in electronic devices.

Lock detecting clock generator 108 includes a phase frequency detector (PFD) 110, a charge pump 112, a loop filter 114, a voltage controlled oscillator (VCO) 116, a frequency divider 118, and a lock detector 120. Elements 110-118 form a phase lock loop circuit (PLL). The PLL inputs a reference_clock signal as a reference clock from clock reference 102 and outputs an output_clock signal as an output clock for general use by other electronic components of an electronic device. Typically, the output clock is frequency divided relative to the reference clock. For example, in various embodiments, the output clock is used by a cell phone to transmit or receive information to or from a cell station, a computer system to operate synchronous digital logic circuits, etc. The PLL may have many possible designs. For ease of understanding, a specific PLL is briefly discussed below.

In an embodiment of the disclosure, PFD 110 is designed to generate an up signal representing a leading edge of the reference clock and a down signal representing a leading edge of the divided_output_clock. For example, D flip-flops with D inputs tied to 1 (logical high) and clock inputs connected to either the reference clock or the divided_output_clock could perform such a function. The D flip-flops are cleared by an AND gate that ANDs positive (Q) outputs of up and down D flip-flops. Such a circuit generates a pulse for the up signal having a leading edge determined by the leading edge of the reference clock, and a pulse for the down signal having a leading edge determined by the leading edge of the divided_output_clock. Falling edges of the up and the down signals occur substantially concurrently when the D flip-flops are cleared.

In an embodiment, charge pump 112 is a capacitor that is charged if the up signal is 1 and discharged if the down signal is 1 and not charged or discharged if both the up and the down signals are 1 (or both are 0). Because such an arrangement may generate undesirable noise, loop filter 114 is provided to filter out this noise. For example, loop filter 114 is a low pass filter such as a resistor in series with a filtering capacitor. A voltage output of loop filter 114 is connected to VCO 116 to control a frequency of the output clock.

VCO 116 outputs the output clock at a frequency that is dependent on the voltage output of loop filter 114. There are many possible designs for a VCO. For example, in an embodiment, an odd number of inverters is connected in a loop to function as an oscillator. The inverters are configured to have delay times that are controlled by an input voltage, thereby forming a VCO. Current starved inverters are suitable for such a purpose. In addition to usual serially connected PMOS and NMOS transistors of an inverter, current mirror PMOS and NMOS transistors are added to limit the inverter current flow based on an input voltage applied to the current mirror transistors. Thus, the input voltage controls currents flowing through the inverters that in turn control the delay times of the inverters. The delay times directly relate to the frequency and phase of the output clock, resulting in an output clock frequency being controlled by the input voltage.

A frequency of the output clock is usually much higher than a reference clock frequency. Thus, PFD 110 inputs a divided_output_clock generated by frequency divider 118. Frequency divider 118 is configured to divide the output clock frequency to generate the divided_output_clock having a phase that corresponds to a phase of the output clock. In an embodiment, frequency divider 118 is a string of flip-flops. However, if a down counter is used, then the down counter is initialized to a desired frequency divide value. By setting the frequency divide value, the output clock frequency is programmably controlled. This arrangement is suitable for cell phone frequency hopping transmissions, for example. After a change in the frequency divide value or after power on, the frequency divided output clock frequency and phase is usually very different from the target frequency and phase. In response, the PLL enters a lock process and automatically adjusts the output clock frequency and phase to that of the target to achieve a lock-state.

At the beginning of the lock process, the up and the down signals of PFD 110 are mismatched. This mismatch changes the charging of charge pump 112 that, in turn, changes the input voltage of VCO 116. The change in the input voltage of VCO 116 changes the frequency and phase of the divided_output_clock signal that, in turn, causes an adjusting change of the up and the down signals. This lock process continues until the frequency and the phase of the divided_output_clock signal come within a match range of the target frequency and phase. In this way, the output clock frequency and phase is brought into the lock-state relative to the target frequency and phase.

Figure 2:
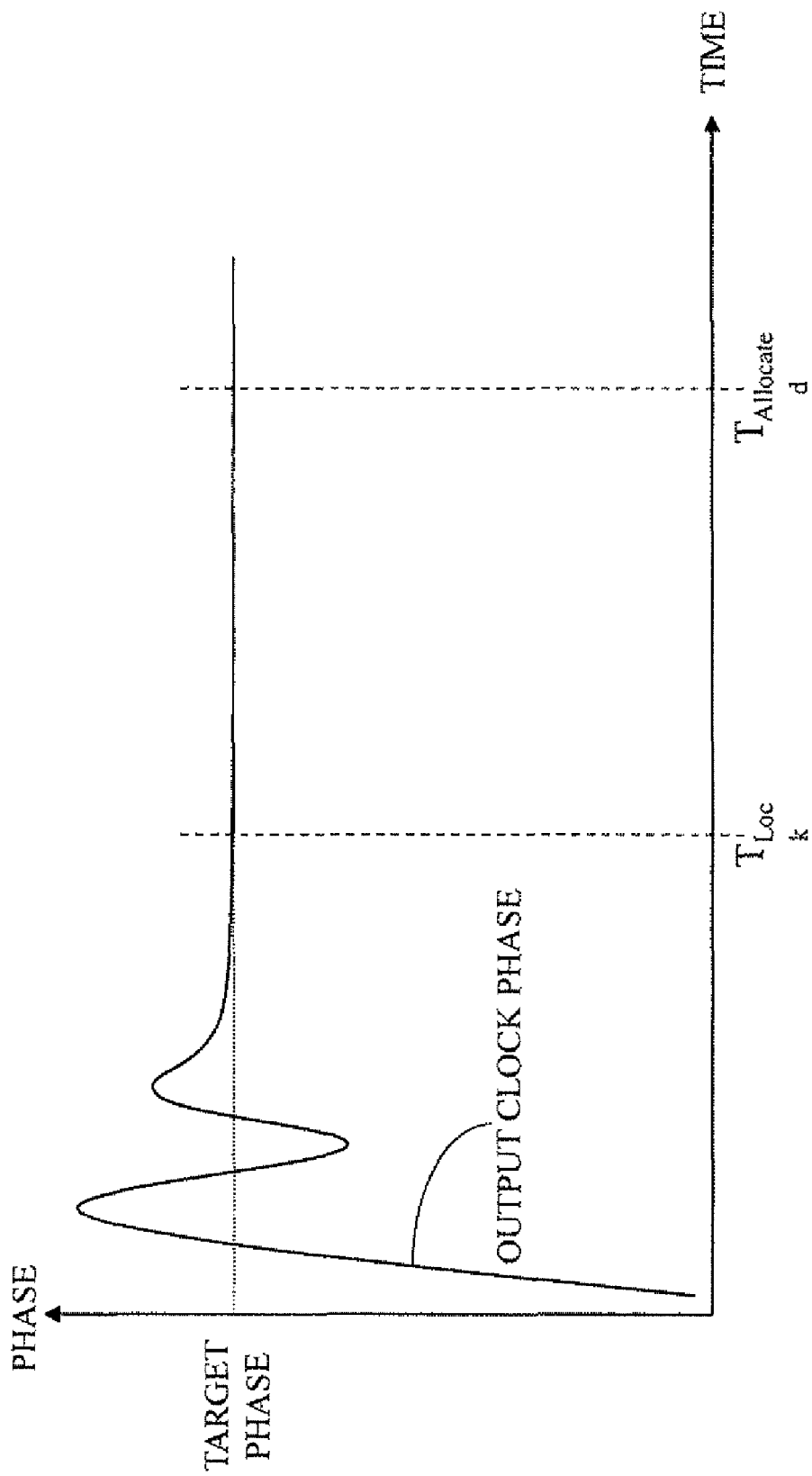
FIG. 2 illustrates a graph of a phase of an output clock relative to a target phase of a reference clock during a PLL lock process.

FIG. 2 shows an example of a change in time of the phase of the output clock as the PLL lock process achieves the lock-state. The phase of the output clock approaches the target phase, arrives at the target phase, overshoots, returns and overshoots again, etc. With each passing of the target phase, the magnitude of the overshoot becomes smaller until a difference between the phase of the output clock and the target phase becomes equal to or less than the match range at which time ($T_{Lock}$) the lock-state is achieved. $T_{Lock}$ is tens or hundreds of microseconds depending on circumstances of a particular integrated circuit design.

$T_{Lock}$ is affected by many physical parameters such as frequencies of signals in the PLL, dynamic and static properties of the PLL, temperature of PLL, etc. The effects of these types of parameters on the lock process are complex and difficult to accurately determine in real time during PLL operation. But, a maximum $T_{Lock}$ is estimated ahead of time that takes account of a worst case condition for each of the above parameters. The maximum $T_{Lock}$ is a predetermined time, $T_{Allocated}$, from either a power on or a change in a desired output clock frequency before the output clock is allocated for use. Other rough estimates of $T_{Lock}$ may also be used, but such estimations may require large safety margins to account for possible worst case circumstances.

Figure 3:
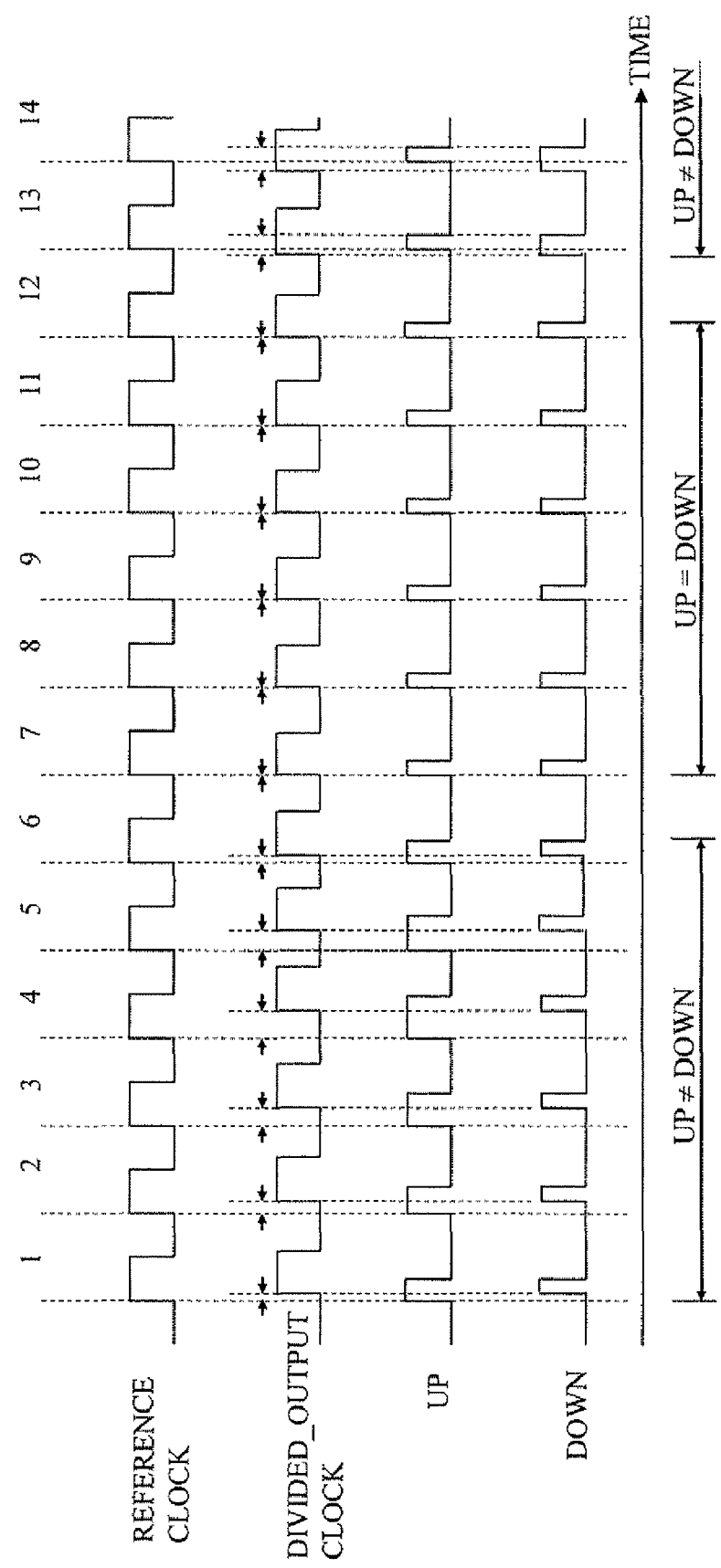
FIG. 3 illustrates timing relationships of a reference_clock signal, a divided_output_clock signal, an up signal, and a down signal.

With reference to FIG. 1, lock detector 120 determines the lock-state based on control signals that are generated by the PLL and that control a characteristic of the output clock that is output by the PLL. For example, in an embodiment, lock detector 120 compares the up and the down signals and based on results of the compare, provides a lock signal that indicates if the lock-state has been achieved. FIG. 3 shows the up and the down signals for different phase relationships between the reference_clock signal and the divided_output_clock signal. For ease of explanation, the top row of numbers in FIG. 3 identifies reference clock cycles (or cycles for short). In cycles 1-6, the leading edge of the divided_output_clock signal lags the corresponding leading edge of the reference_clock signal. In these cycles, the up signal is wider than the down signal. In cycles 13 and 14, the leading edge of the divided_output_clock signal leads the corresponding leading edge of the reference_clock signal, and the down signal is wider than the up signal. In cycles 7-12, the leading edges of the divided_output_clock signal and the reference_clock signal are aligned and the up signal is equal to the down signal. Thus, a lock-state occurs when the up signal is equal to the down signal. However, due to physical realities of electronic components, noise, etc., exact equality between the up and the down signals may be difficult to achieve in a practical PLL. Thus, lock detector 120 provides the match range between the up and the down signals that specifies a first component of a guard band that is used to determine if the lock-state is achieved.

Figure 4:
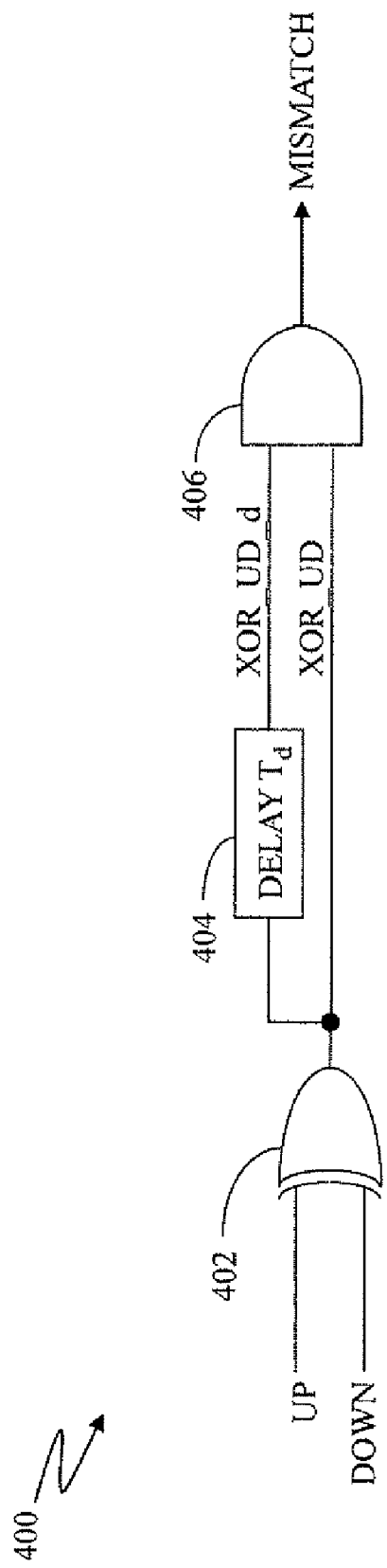
FIG. 4 illustrates a circuit diagram of a mismatch detector.

FIG. 4 shows a block diagram of a mismatch detector 400 that is part of lock detector 120 of FIG. 1. Mismatch detector determines whether a difference between the up and the down signals exceeds the match range, in accordance with an embodiment of the disclosure. An exclusive OR circuit (XOR) 402 receives the up and the down signals as inputs. XOR 402 acts as a comparator and outputs an XOR_UD signal as a compare result that is a 0 (logical low) if both the up and the down are either 1 or 0, and a 1 otherwise. The XOR_UD signal is input to a delay circuit 404 and an AND circuit 406. Delay circuit 404 outputs an XOR_UD_d signal that is input to AND circuit 406. Delay circuit 404 and AND circuit 406 form a filter that sets the match range based on a delay time $T_d$ of delay circuit 404. AND circuit 406 outputs a mismatch signal that forms a pulse if the up and the down signals exceeds the match range and thus, do not match.

The delay time $T_d$ is set to an appropriate value depending on circumstances of a particular design. For a 40 nanometer chip, $T_d$ is in the tens to hundreds of picoseconds.

Figure 5:
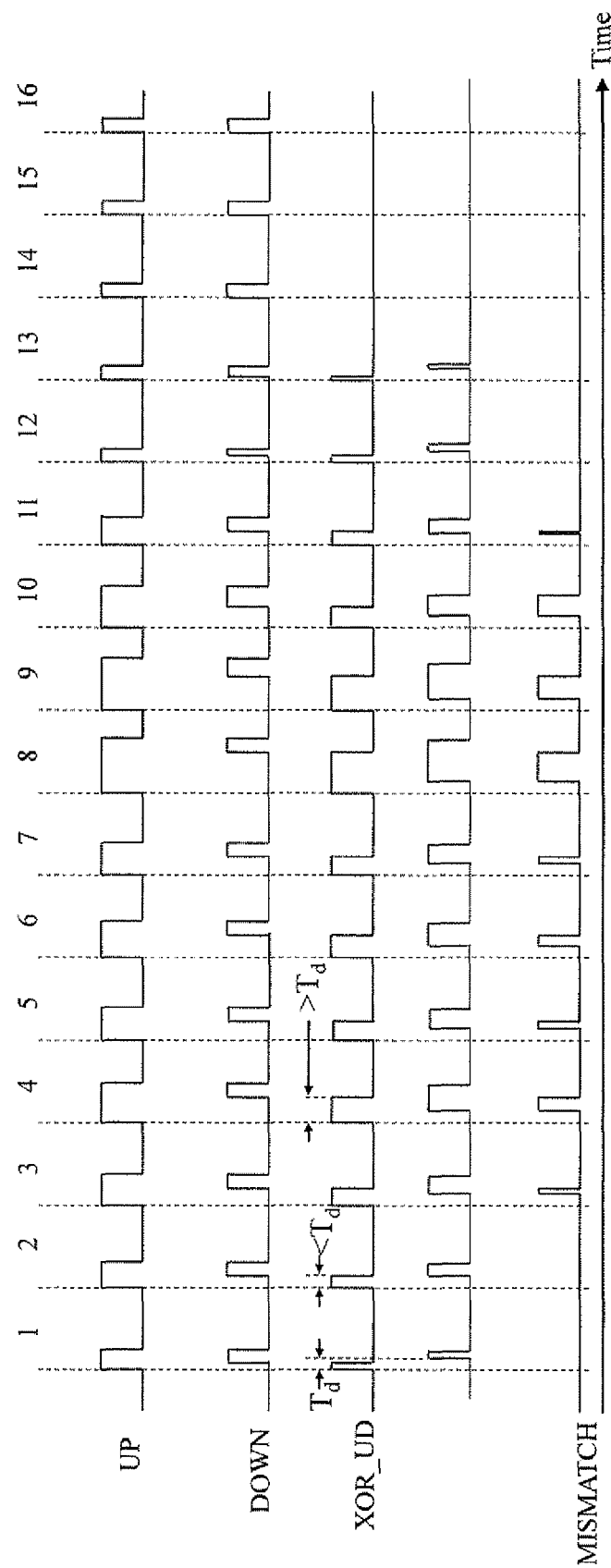
FIG. 5 illustrates timing relationships of signals of the mismatch detector.

FIG. 5 shows the relationships among the signals of mismatch detector 400. As in FIG. 3, the top row of numbers indicates cycles of the reference clock for ease of discussion. In cycles 1, 2 and 12-16, the time differences between leading edges of the up and the down signals is less than $T_d$. Thus, the XOR_UD and XOR_UD_d signals do not overlap, and the mismatch signal is 0. However, in cycles 3-11, the time differences between leading edges of the up and the down signals are not less than $T_d$, and the mismatch signal is a 1 during the time when the XOR_UD and XOR_UD_d signals overlap.

Figure 6:
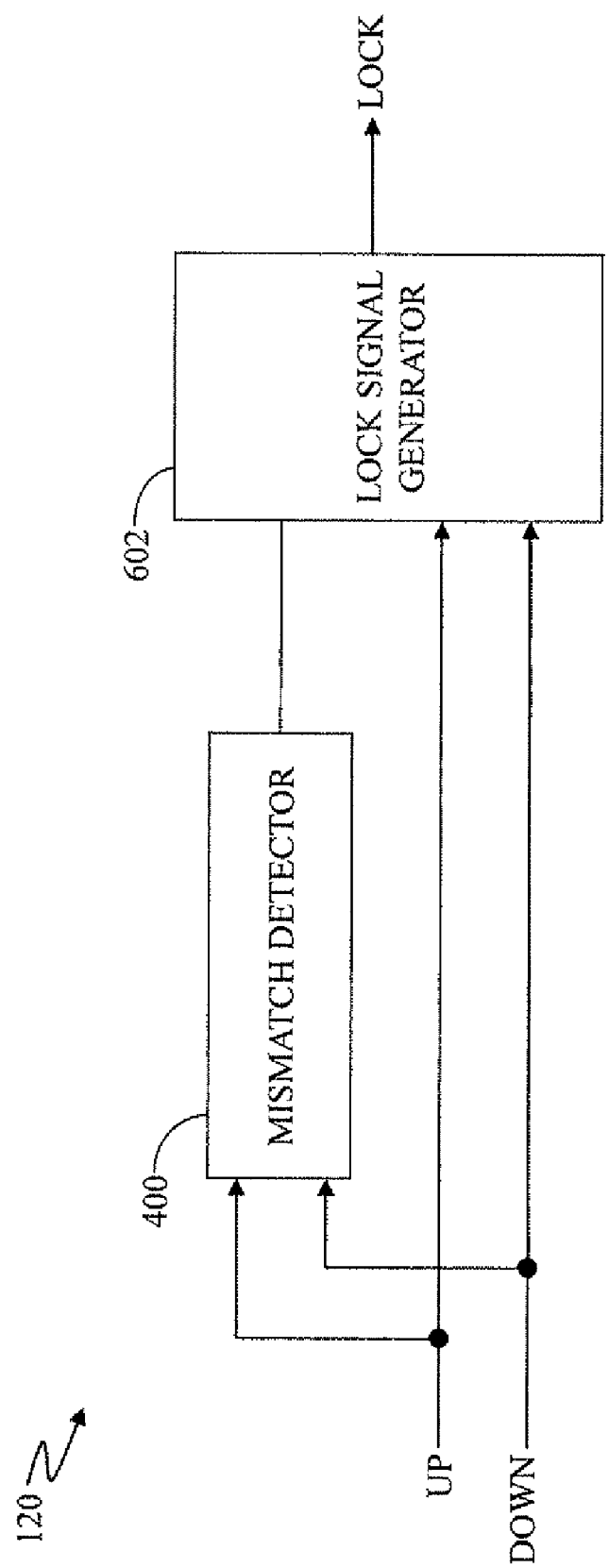
FIG. 6 illustrates a block diagram of a lock detector.

FIG. 6 shows a block diagram of lock detector 120 that includes mismatch detector 400 and a lock-signal-generator 602. As discussed above in connection with FIG. 2, the phase of the output clock passes by the target phase during the lock process. For this reason, mismatch detector 400 outputs a mismatch signal of 0 during the lock process when the phase of the output clock is equal to the target phase even though the PLL is not in the lock-state. Thus, the lock-signal-generator 602 introduces a delay before indicating a lock-state as a second component of the guard band.

Figure 7:
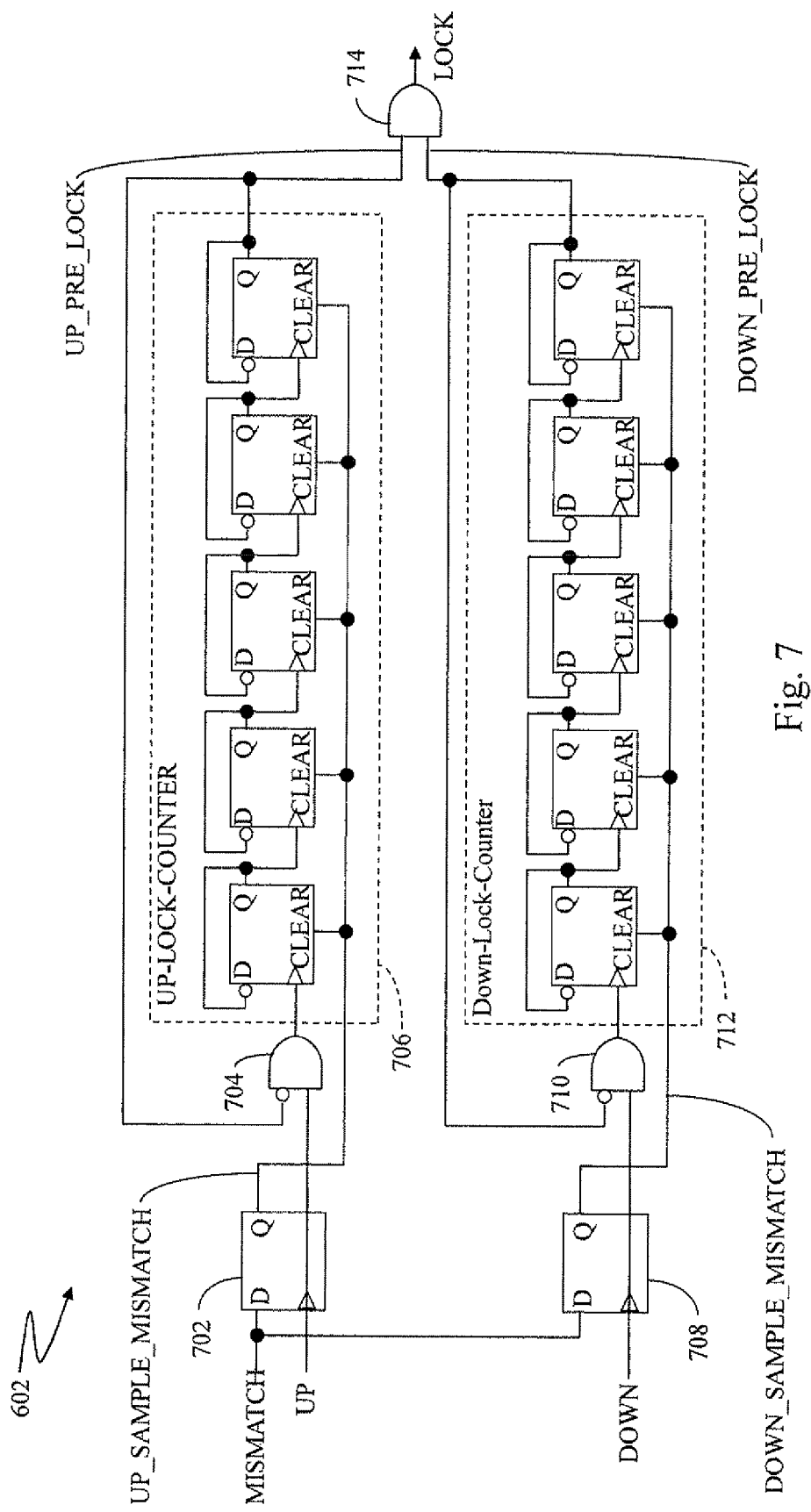
FIG. 7 illustrates a block diagram of a lock-signal-generator.

FIG. 7 shows a circuit diagram of lock-signal-generator 602. Lock-signal-generator 602 counts a set-value number of reference clock cycles when the difference between the up and the down signals does not exceed the match range. Lock-signal-generator 602 prevents the lock signal from indicating the lock-state unless the mismatch signal remained 0 after a 1 to 0 transition for at least a set-value number of reference clock cycles and divided_output_clock cycles. Thus, lock-signal-generator 602 delays an indication of the lock-state for a time duration that is equal to: set-value×$T_{Ref}$, where $T_{Ref}$ is a cycle time of the reference clock. $T_{Ref}$ is also a cycle time of the divided_output_clock because when near the lock-state, the cycle times of the divided_output_clock and the reference clock are very close to each other.

Lock-signal-generator 602 generates an up_pre_lock signal and a down_pre_lock signal. The up_pre_lock signal and the down_pre_lock signal are ANDed by AND circuit 714 to form the lock signal that is output to indicate the lock-state of the PLL. Lock-signal-generator 602 includes identical circuits for an up portion that generates the up_pre_lock signal and a down portion that generates the down_pre_lock signal.

The up portion includes an up-mismatch-signal-sampler 702, an up clock control AND circuit 704 and an up-lock-counter 706. Up-mismatch-signal-sampler 702 is a D flip-flop having its D input connected to the mismatch signal and the clock input connected to the up signal. The D flip-flop outputs an up_sample_mismatch signal at the Q output.

In an embodiment, up-lock-counter 706 is suitably a ripple counter formed by serially connected 5 D flip-flops where, except for the first D flip-flop, a Q output of a prior D flip-flop is connected to a clock input of a following D flip-flop. The Q output of the last flip-flop is connected to the clock input of the first D flip-flop through AND circuit 704 via an inverting input of AND circuit 704. Clear inputs of the 5 D flip-flops are connected together to form a clear input of up-lock-counter 706. The clear input is connected to the up_sample_mismatch signal. A count value of the 5 D flip-flops is cleared if the up_sample_mismatch signal is 1, and up-lock-counter 706 is prevented from counting. If the up_sample_mismatch signal is 0, the clear input is 0, and up-lock-counter 706 is allowed to count.

Up-mismatch-signal-sampler 702 samples the mismatch signal upon a leading edge of the up signal to generate the up_sample_mismatch signal. If the up_sample_mismatch signal is 1, up-lock-counter 706 is cleared, preventing up-lock-counter 706 from further counting. The up signal is ANDed with an inverted up_pre_lock signal by AND circuit 704. An output of AND circuit 704 forms an up_counter_clock signal that clocks up-lock-counter 706. Thus, up-lock-counter 706 stops counting if the up_pre_lock signal is 1 preserving an up-count value in up-lock-counter 706 until cleared.

The down portion includes components 708, 710 and 712 that correspond to components 702, 704 and 706 of the up portion and perform the same corresponding functions using the down signal instead of the up signal. Thus, lock-signal-generator 602 does not indicate the lock-state until the mismatch signal has remained 0 for $T_{Ref}$ as counted by both the up portion and the down portion.

Counting a number of leading edges of the up signal is the same as counting a number of reference clock cycles. When the PLL is very close to the lock-state, counting the down signal is also the same as counting the reference clock cycles. As noted earlier, the output clock may have a frequency that is much higher than that of the reference clock. However, frequency divider 118 outputs the divided_output_clock signal. The divided_output_clock signal has a same number of cycles as cycles of the output clock that correspond to that of the reference clock. Thus, when the PLL is very close to the lock-state, counting the down signal is the same as counting the reference clock cycles.

Although FIG. 7 shows up-lock-counter 706 and down-lock-counter 712 as ripple counters, other types of counters may be used with appropriate adaptations. For example, for a down counter implementation, the down counter is set to the set-value instead of being cleared by the up_sample_mismatch signal or the down_sample_mismatch signal. The up_pre_lock signal or the down_pre_lock signal is set to 1 if the respective counter value reaches 0.

Figure 8:
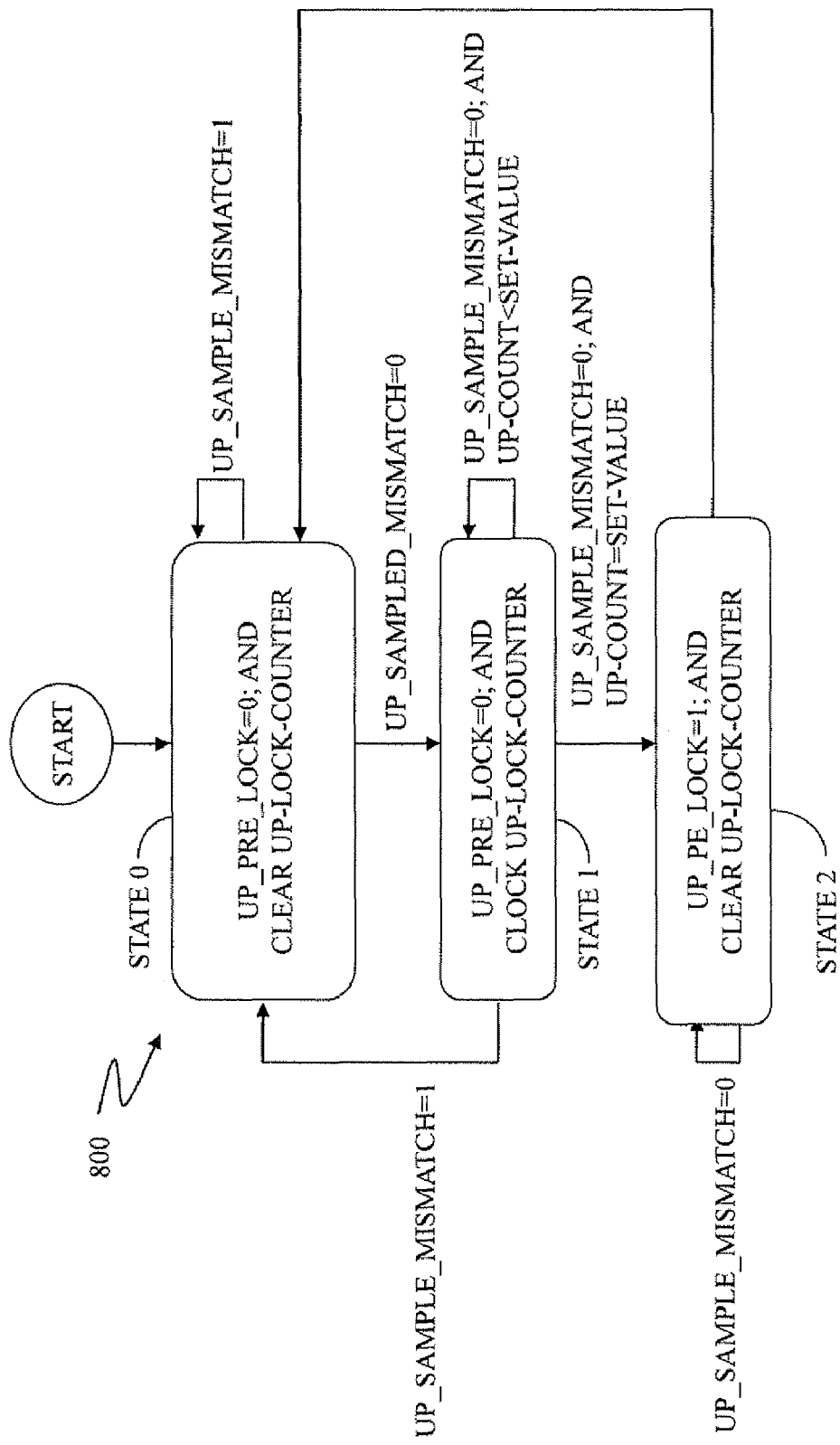
FIG. 8 illustrates a state machine diagram of the lock-signal-generator.

FIG. 8 shows a state machine 800 that controls the functions implemented by the up portion of lock-signal-generator 602 in accordance with an embodiment of the disclosure. The up and the down portions of lock-signal-generator 602 implement the same state machine. The only difference is whether the input is the up signal or the down signal. Thus, the following description is changed for the down portion state machine if the "up" is changed to "down" and reference numbers are replaced by corresponding reference numbers for down components.

In state 0, state machine 800 sets the up_pre_lock signal to 0, and clears up-lock-counter 706. If the up_sample_mismatch signal is 1, state machine 800 remains in state 0. If the up_sample_mismatch signal is 0, then state machine 800 transitions to state 1.

In state 1, state machine 800 sets the up_pre_lock signal to 0, and begins clocking up-lock-counter 706 with the up signal. If the up_sample_mismatch is 1, then state machine 800 transitions to state 0. State machine 800 remains in state 1 if the up_sample_mismatch signal is 0 and a count value of up-lock-counter 706 is less than the set-value. If the up_sample_mismatch signal is 0 and up-lock-counter 706 has a value that is equal to the set-value, then state machine 800 transitions to state 2.

In state 2, state machine 800 sets the up_pre_lock signal to 1. Thus, state 2 indicates that the PLL is in the lock-state for the up portion. State machine 800 remains in state 2 if the up_sample_mismatch signal is 0, but transitions to state 0 if the up_sample_mismatch signal is a 1.

Figure 9:
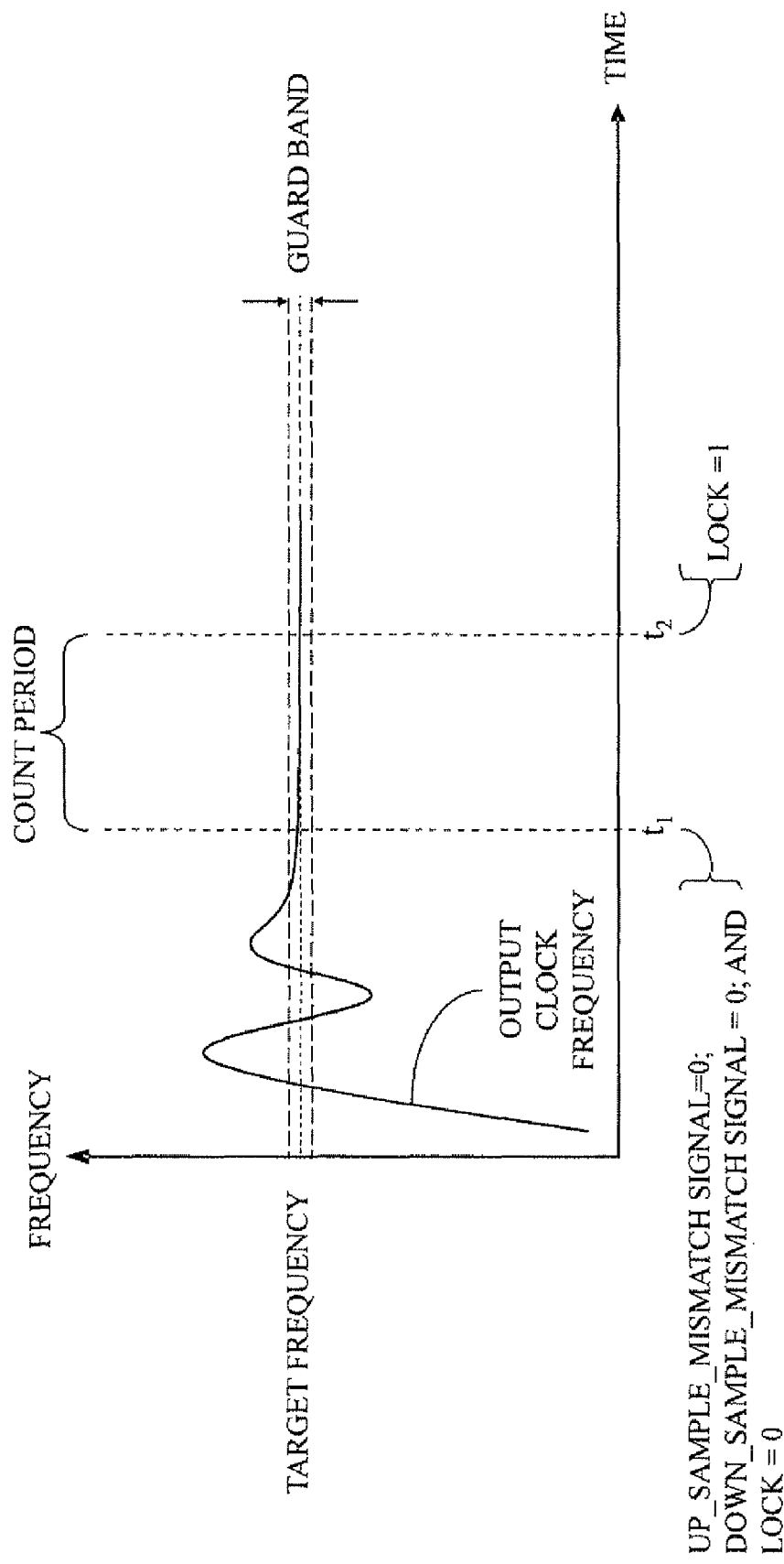
FIG. 9 illustrates a graph of a frequency of the output clock relative to a target frequency during the PLL lock process.

FIG. 9 shows an example of frequency transitions of the output clock during the lock process. Similar to FIG. 2, the frequency of the output clock approaches a target frequency, comes within the match range component of the guard band, passes the target frequency, overshoots, returns to the target frequency, undershoots, returns again, etc. Each time the frequency of the output clock equals the target frequency, the up_sample_mismatch and down_sample_mismatch becomes 0 and the up-lock-counter 706 and down-lock-counter 712 begins counting. However, during the early periods of the lock process, the frequency of the output clock does not remain near the target frequency for very long. The up_sample_mismatch and the down_sample_mismatch signals soon become 1, and up-lock-counter 706 and down-lock-counter 712 are cleared.

At time $t_1$, the frequency of the output clock comes within the match range of the target frequency and remain there. Thus, starting at time $t_1$, up-lock-counter 706 and down-lock-counter 712 begin counting the up and the down signals at least until the up_pre_lock and the down_pre_lock signals become 1 at time $t_2$ when the up-lock counter 706 and down-lock-counter 712 reach the set-value. At time $t_2$, the lock signal is set to 1 indicating that the lock-state is reached and the output clock is ready to be used.

Figure 10:
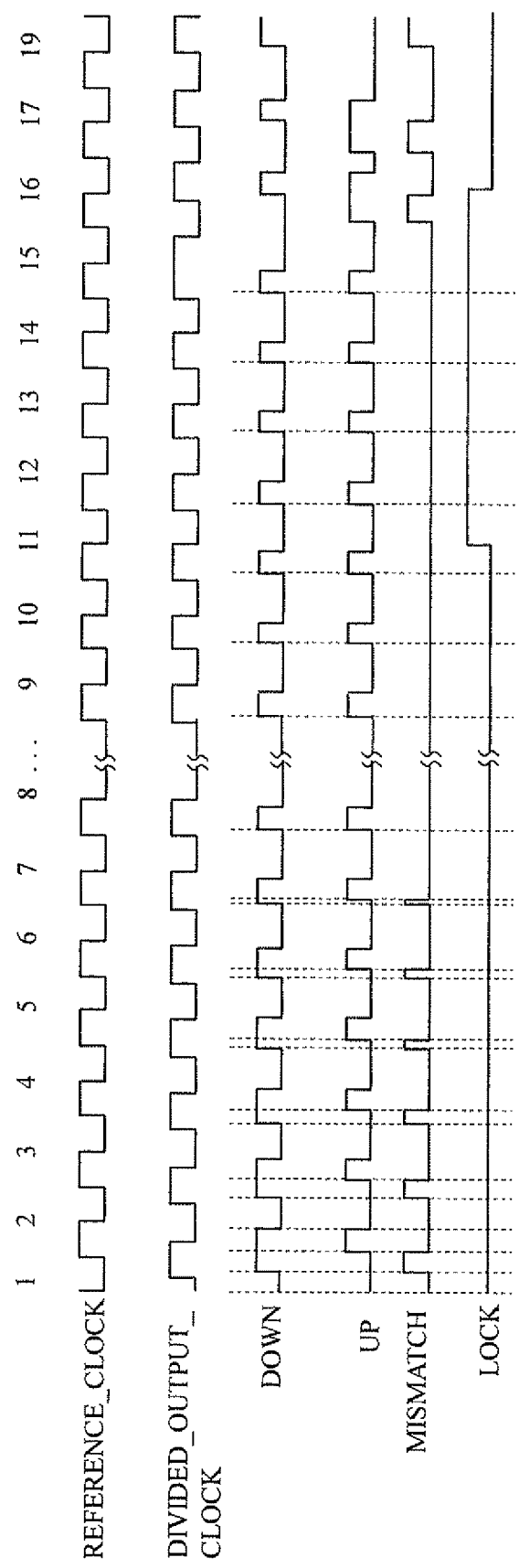
FIG. 10 illustrates timing relationships of the lock signal and other signals of the lock detecting clock generator.

FIG. 10 shows a timing diagram of the lock signal relative to the reference_clock, the divided_output_clock, the down, the up and the mismatch signals. The vertical dashed lines show the relative alignment between the down and the up signals. As before, the top row of numbers identifies cycles of the reference clock. While for the most part, these numbers identify consecutive cycles, a number of cycles between 8 and 9 is indeterminate as indicated by the break in the signals.

In cycles 1-7, the up and the down signals do not match as specified by the match range component of the guard band, and the mismatch signal are pulses. Between cycles 8-15, the up and the down signals match, and the mismatch signal is 0. The lock signal stays a 0 until cycle 11 when both the up-lock-counter 706, the down-lock-counter 712 reach the set-value, and the up_pre_lock and the down_pre_lock signals become 1. FIG. 10 shows the lock signal rising to 1 delayed after the leading edge of the up and the down signals to illustrate a delay time through the ripple counters and AND circuits 704 and 714.

At cycle 16, the lock signal drops to 0 again because the up and the down signals are mismatched as indicated by the mismatch signal. The lock signal drops to 0 after the leading edge of the down signal because this is the first time when one of the up_sample_mismatch and the down_sample_mismatch signals becomes a 1 and clears the corresponding counter 706 or 712.

Figure 11:
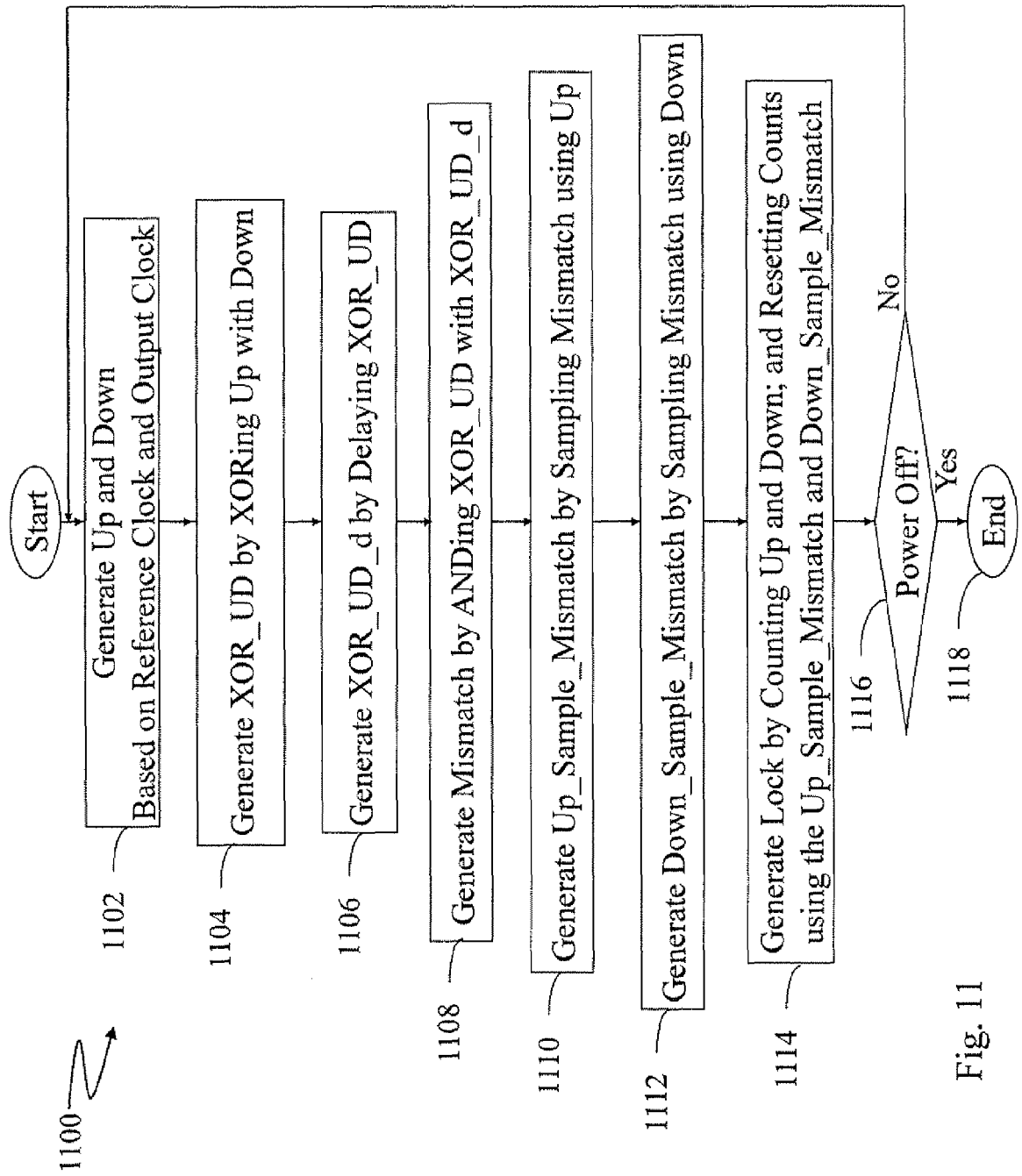
FIG. 11 illustrates a flow chart of a process for generating the lock signal.

FIG. 11 shows a flow chart 1100 of a process performed by lock detector 120. The order of steps of the process as shown is for ease of understanding. An actual order of the steps is determined by a specific implementation. For example, in an embodiment, these steps are concurrently performed by an integrated circuit implementation.

In step 1102, the up and the down signals are generated in parallel based on the reference clock and the output clock, then the process goes to step 1104. In step 1104, the up and the down signals are XORed to generate the XOR_UD signal, and the process goes to step 1106. In step 1106, the XOR_UD signal is delayed by $T_d$ to generate the XOR_UD_d signal, and the process goes to step 1108. In step 1108, XOR_UD is ANDed with XOR_UD_d to generate the mismatch signal, and the process goes to step 1110.

In step 1110, the mismatch signal is sampled using the up signal to generate the up_sample_mismatch signal, and the process goes to step 1112. In step 1112, the mismatch signal is sampled using the down signal to generate the down_sample_mismatch signal, and the process goes to step 1114. In the embodiment shown in FIG. 7, up-mismatch-signal-sampler 702 and down-mismatch-signal-sampler 708 operate in parallel to concurrently generate the up_sample_mismatch signal and the down_sample_mismatch signal. In step 1114, the up and the down signals are counted if the mismatch signal is a 0 for generating the lock signal, and the process goes to step 1116. In step 1116, if power is not off, the process returns to step 1102. If power is off, the process goes to step 1118 and ends.

Figure 12:
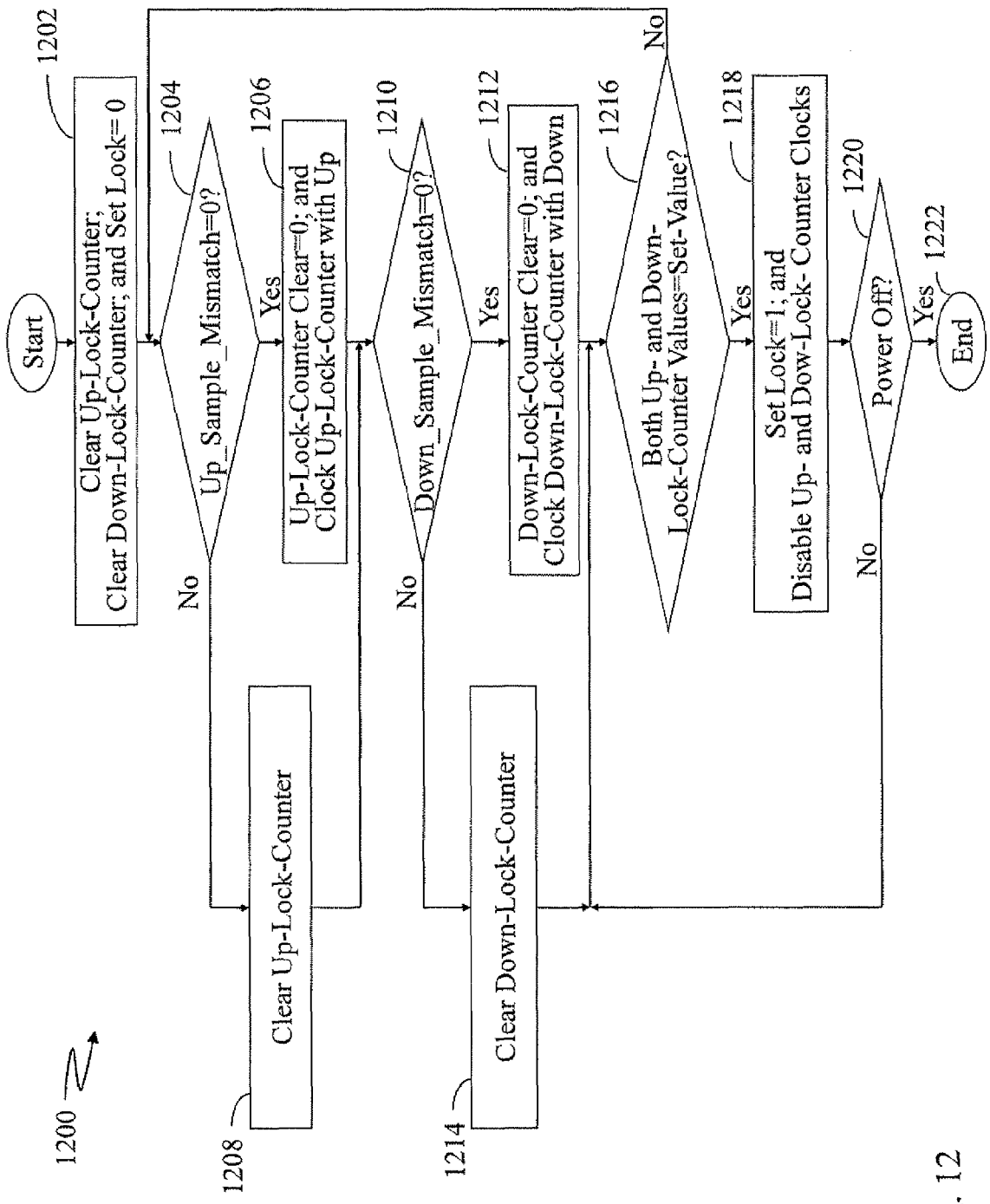
FIG. 12 illustrates a flow chart of a process for the lock signal generator.

FIG. 12 shows a flow chart 1200 that illustrates the process of step 1114 in greater detail. In step 1202, the up-lock-counter 706 and the down-lock-counter 712 are cleared, the lock signal is set to 0, and the process goes to step 1204. In step 1204, the process determines whether the up_sample_mismatch signal is a 0. If the up_sample_mismatch signal is a 0, then the process goes to step 1206. Otherwise, the process goes to step 1208. In step 1206, the clear input of up-lock-counter 706 is set to 0, the up signal is counted by up-lock-counter 706, and the process goes to step 1210. In step 1208, up-lock-counter 706 is cleared by setting the clear input to 1, and the process goes to step 1210. Because the clear input of up-lock-counter 706 is set to 1, the up-lock-counter 706 does not count a number of the up signal.

In step 1210, the process determines whether the down_sample_mismatch signal is a 0. If the down_sample_mismatch signal is a 0, then the process goes to step 1212. Otherwise, the process goes to step 1214. In step 1212, the clear of down-lock-counter 712 is set to 0, the down signal is counted by the down-lock-counter 712, and the process goes to step 1216. In step 1214, down-lock-counter 712 is cleared by setting the clear input to 1, and the process goes to step 1216. Because the clear input of down-lock-counter 712 is set to 1, the down-lock-counter 712 does not count a number of the down signal.

In the embodiment shown in FIG. 7, the process for counting the up-sample-mismatch signal in steps 1204-1208 and the down-sampled-mismatch signal in steps 1210-1212 are performed simultaneously.

In step 1216, the process determines whether the count values of both the up-lock-counter 706 and the down-lock-counter 712 are equal to the set-value. If the count values are equal to the set-value, the process goes to step 1218. Otherwise, the process returns to step 1204. In step 1218, the lock signal is set to 1, the up and the down signals are prevented from further clocking the up-lock-counter 706 and the down-lock-counter 712, and the process goes to step 1220. In step 1220, if power is not off, the process returns to step 1216. If power is off, the process goes to step 1222 and ends.

Figure 13:
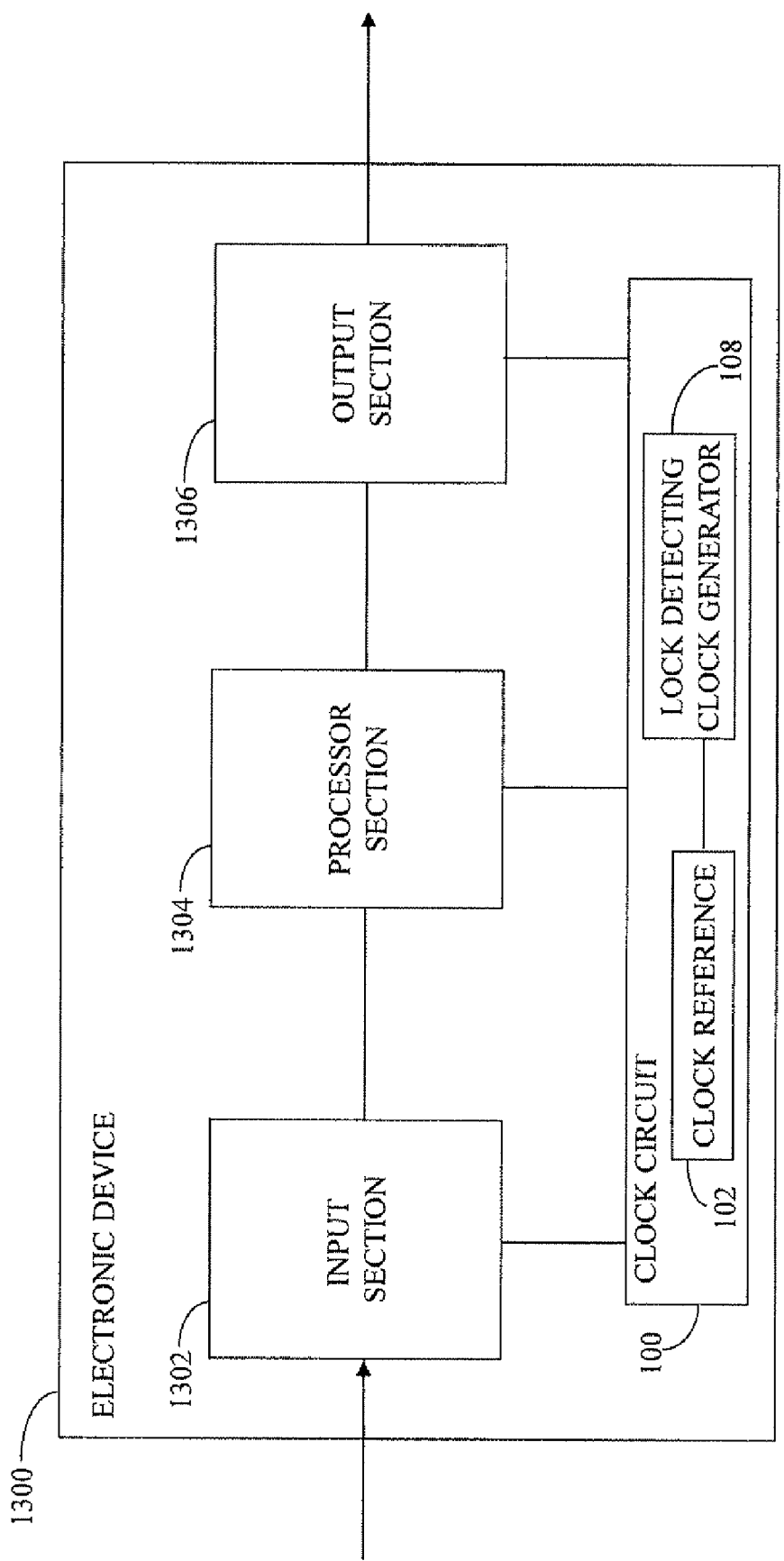
FIG. 13 illustrates a block diagram of an electronic device incorporating the clock circuit of FIG. 1.

FIG. 13 shows a block diagram of a suitable electronic device 1300 such as system-on-chip (SOC) devices, packet processors, network processors, computing devices, modem or application processors for cell phones, etc. that includes clock circuit 100. For example, a cell phone includes: a microphone, a wireless receiver, and a keyboard as an input section 1302; hardwired logic and a microprocessor as a processor section 1302; and a speaker, a wireless transmitter, and a display as an output section 1306.

If frequency hopping is implemented in the cell phone, the microprocessor changes a frequency of an output clock to transmit and receive signals from a base station. Thus, the frequency of transmission or reception jumps among a set of frequencies to obtain the best signal-to-noise ratio. The microprocessor instructs lock detecting clock generator 108 to change the frequency of the output clock that is sent to the wireless transmitter or receiver at prescribed times. The wireless transmitter or receiver monitors the lock signal, and begins transmitting or receiving as soon as the lock signal is 1 without delaying for a fixed wait time that is determined based on worst case conditions.

While the invention has been described in conjunction with specific embodiments thereof that are proposed as examples, it is evident that many alternatives, modifications, and variations will be apparent to those skilled in the art. Accordingly, embodiments of the invention as set forth herein are intended to be illustrative, not limiting. There are changes that may be made without departing from the scope of the invention.

What is claimed is:

1. A clock generator comprising:
a phase lock loop configured to generate an output clock; and
a lock detector coupled to the phase lock loop, the lock detector configured to generate a lock signal based on control signals generated by the phase lock loop, the control signals controlling a characteristic of the output clock, the lock signal indicating a lock-state of the output clock, the lock detector including:
a mismatch detector configured to detect a difference between a phase of a reference clock and a phase of the output clock and generating a mismatch signal based on the difference; and
a lock-signal-generator coupled to the mismatch detector, the lock-signal-generator configured to generate the lock signal based on the mismatch signal, the lock-signal-generator having:
a mismatch-signal-sampler configured to output a sample_mismatch signal; and
a lock-counter coupled to the mismatch-signal-sampler, the lock-counter configured to be clocked by at least one of the control signals and cleared by the sample_mismatch signal, the lock-signal-generator outputting the lock signal based on an output of the lock-counter.

2. The clock generator of claim 1 wherein the mismatch detector comprises:
a comparator configured to compare the phase of the reference clock to the phase of the output clock and outputs a compare output; and
a filter coupled to the comparator, the filter filtering the compare output to generate the mismatch signal.

3. The clock generator of claim 1 included in an electronic device, the electronic device comprising:
a processor section; and
a clock section.

4. A clock generator comprising:
a phase lock loop generating an up signal and a down signal, the up signal indicating a phase of a reference clock and the down signal indicating a phase of an output clock;
a mismatch detector configured to generate a mismatch signal based on whether a phase difference between a phase of the up signal and a phase of the down signal exceeds a match range; and
a lock-signal-generator configured to generate a lock signal based on the mismatch signal, the up signal, and the down signal, the lock-signal-generator including:
an up-mismatch-signal-sampler configured to sample the mismatch signal based on the up signal to generate an up_sample_mismatch signal;
a down-mismatch-signal-sampler configured to sample the mismatch signal based on the down signal to generate a down_sample_mismatch signal;
an up-lock-counter coupled to the up-mismatch-signal-sampler, the up-lock-counter configured to be clocked by an up-counter-clock signal and cleared by the up_sample_mismatch signal, wherein an up_pre_lock signal is generated if an up-count of the up-lock-counter equals a set-value;
a second AND circuit ANDing the up_pre_lock signal with the up signal to generate an up_counter_clock signal, the up_counter_clock signal being stopped from clocking the up-lock-counter if the up-count equals the set-value;
a down-lock-counter coupled to the down-mismatch-signal-sampler, the down-lock-counter configured to be clocked by a down_counter_clock signal and cleared by the down_sample_mismatch signal, wherein a down_pre_lock signal is generated if a down-count of the down-lock-counter equals the set-value;
a third AND circuit ANDing the down_pre_lock signal with the down signal to the down_counter_clock signal, the down_counter_clock signal being stopped from clocking the down-lock-counter if the down-count equals the set-value; and
a fourth AND circuit ANDing the up_pre_lock signal and the down_pre_lock signal to generate the lock signal.

5. The clock generator of claim 4 wherein the mismatch detector comprises:
an XOR circuit XORing the up signal with the down signal;
a delay circuit coupled to the XOR circuit, the delay circuit delaying an output of the XOR circuit by a delay of $T_d$ that specifies the match range; and
a first AND circuit ANDing: 1) the output of the XOR circuit, and 2) an output of the delay circuit to form the mismatch signal.

6. A lock detector of a phase lock loop comprising:
a mismatch detector configured to detect if a difference in phase between a reference clock and an output clock exceeds a match range; and
a lock-signal-generator coupled to the mismatch detector, the lock-signal-generator configured to generate a lock signal indicating a lock-state of the output clock relative to the reference clock if the difference in phase does not exceed the match range for a set-value of reference clock cycles.

7. The lock detector of claim 6 wherein
the mismatch detector comprises an XOR circuit, the XOR circuit comparing the phase of the reference clock and the phase of the output clock and filtering a compare result of the XOR circuit based on the match range; and the match range is specified by an AND circuit ANDing an output of the XOR circuit and the output of the XOR circuit delayed by a $T_d$ time value.

8. The lock detector of claim 6 wherein the lock-signal-generator comprises a first counter that counts a first number of reference clock cycles and a second counter that counts a second number of output clock cycles that correspond to counted reference clock cycles, the first and second counters being cleared if the difference in phase between the reference clock and the output clock exceeds the match range, the lock signal being generated if the first and second counters counted a set-value of respective clock cycles.

9. A method for generating a clock comprising:

generating an output clock using a phase lock loop;

generating a lock signal based on control signals generated by the phase lock loop, the control signals controlling a characteristic of the output clock, the lock signal indicating that the output clock is in a lock-state;

detecting a difference between a phase of a reference clock and a phase of the output clock;

generating a mismatch signal based on the difference; and generating the lock signal based on the mismatch signal, generating the lock signal including:
  sampling the mismatch signal to generate a sample_mismatch signal;
  counting at least one of the control signals if permitted by the sample_mismatch signal to generate a count value; and
  outputting the lock signal if the count value equals a set-value.

10. The method of claim 9 wherein the detecting the difference comprises:

comparing the phase of the reference clock to the phase of the output clock to generate a compare output; and filtering the compare output to generate the mismatch signal.

11. A method for generating a clock comprising:

generating an up signal that indicates a phase of a reference clock;

generating a down signal that indicates a phase of an output clock;

detecting a difference between the up signal and the down signal;

generating a mismatch signal based on the difference; and generating a lock signal based on the up signal, the down signal and the mismatch signal, generating the lock signal including:
  sampling the mismatch signal using the up signal to generate an up_sample_mismatch signal;
  sampling the mismatch signal using the down signal to generate a down_sample_mismatch signal;
  counting the up signal to generate an up-count unless prevented by the up_sample_mismatch signal;
  counting the down signal to generate a down-count unless prevented by the down_sample_mismatch signal; and
  generating the lock signal if both the up-count and the down-count equal a set-value.

12. The method of claim 11 wherein:

the detecting the difference comprises performing an XOR of the up signal and the down signal; and the generating the mismatch signal comprises performing an AND of an output of the XOR and the output of the XOR delayed by a time $T_d$.

13. A method for detecting a lock-state of a phase lock loop comprising:

detecting whether a difference in phase of a reference clock and an output clock exceeds a match range;

generating a mismatch signal if the match range is not exceeded; and generating a lock signal, the lock signal indicating a lock-state of the output clock relative to the reference clock based on whether the match range is not exceeded for a set-value of reference clock cycles.

14. The method of claim 13 wherein:

the generating the mismatch signal comprises delaying a value of the difference in time by time $T_d$ to generate a delayed value, and ANDing the value and the delayed value to generate the mismatch signal; and the generating the lock signal comprises counting a number of reference clock cycles if not prevented by the mismatch signal.

* * * * *